(12) United States Patent
Medhat et al.

(10) Patent No.: US 11,499,218 B2
(45) Date of Patent: Nov. 15, 2022

(54) SELECTIVE STEP COVERAGE FOR MICRO-FABRICATED STRUCTURES

(71) Applicant: Si-Ware Systems, Cairo (EG)

(72) Inventors: Mostafa Medhat, Heliopolis (EG); Bassem Mortada, Cairo (EG); Yasser Sabry, Cairo (EG); Sebastian Nazeer, Les Ulis (FR); Yasseen Nada, Heliopolis (EG); Mohamed Sadek, Cairo (EG); Bassam A. Saadany, Cairo (EG)

(73) Assignee: Si-Ware Systems, Cairo (EG)

(*) Notice: Subject to any disclaimer, the term of this patent is extended or adjusted under 35 U.S.C. 154(b) by 108 days.

(21) Appl. No.: 16/730,947

(22) Filed: Dec. 30, 2019

(65) Prior Publication Data

US 2020/0130006 A1    Apr. 30, 2020

Related U.S. Application Data

(62) Division of application No. 15/047,032, filed on Feb. 18, 2016, now Pat. No. 10,562,055.
(Continued)

(51) Int. Cl.
*C23C 14/04* (2006.01)
*C23C 16/04* (2006.01)
(Continued)

(52) U.S. Cl.
CPC ............ *C23C 14/042* (2013.01); *B05B 12/20* (2018.02); *B81C 1/0038* (2013.01);
(Continued)

(58) Field of Classification Search
CPC ..... C23C 14/04; C23C 14/042; C23C 14/044; C23C 14/046; H01L 21/0465;
(Continued)

(56) References Cited

U.S. PATENT DOCUMENTS 5,853,805 A    12/1998  Mizuguchi et al.
6,884,327 B2   4/2005   Pan et al.
(Continued)

FOREIGN PATENT DOCUMENTS

CN    1713342    12/2005
CN    1834282    9/2006
(Continued)

OTHER PUBLICATIONS

TW 480572 A (Derwent Abstract) (Year: 2002).*
(Continued)

*Primary Examiner* — Michael A Band
(74) *Attorney, Agent, or Firm* — Loza & Loza, LLP; Holly Rudnick (57) ABSTRACT

A shadow mask having two or more levels of openings enables selective step coverage of micro-fabricated structures within a micro-optical bench device. The shadow mask includes a first opening within a top surface of the shadow mask and a second opening within the bottom surface of the shadow mask. The second opening is aligned with the first opening and has a second width less than a first width of the first opening. An overlap between the first opening and the second opening forms a hole within the shadow mask through which selective coating of micro-fabricated structures within the micro-optical bench device may occur.

20 Claims, 7 Drawing Sheets

Related U.S. Application Data (60) Provisional application No. 62/119,065, filed on Feb. 20, 2015.

(51) Int. Cl.
*H01L 21/68* (2006.01)
*B81C 1/00* (2006.01)
*B05B 12/20* (2018.01)

(52) U.S. Cl.
CPC ...... *B81C 1/00373* (2013.01); *B81C 1/00404* (2013.01); *C23C 14/04* (2013.01); *C23C 16/04* (2013.01); *C23C 16/042* (2013.01); *H01L 21/682* (2013.01); *B81C 2201/0183* (2013.01); *B81C 2201/0198* (2013.01); *H01J 2229/07* (2013.01)

(58) Field of Classification Search
CPC . H01L 21/682; H01L 41/331; H01L 51/0011; B05B 12/20; B81C 1/00404; B81C 1/00373; B81C 1/0038
See application file for complete search history.

(56) References Cited

U.S. PATENT DOCUMENTS

| | | |
|---|---|---|
| 7,268,406 B2 | 9/2007 | Yotsuya et al. |
| 7,796,267 B2 | 9/2010 | Saadany et al. |
| 9,365,923 B2 | 6/2016 | Ochi et al. |
| 2006/0021869 A1 | 2/2006 | Brody |
| 2007/0042527 A1 | 2/2007 | Tuckeerman et al. |
| 2013/0100424 A1 | 4/2013 | Sabry et al. |
| 2013/0299345 A1 | 11/2013 | Abarra et al. |
| 2014/0020628 A1 | 1/2014 | Wang et al. |
| 2014/0220715 A1 | 8/2014 | Kang |
| 2015/0068455 A1 | 3/2015 | Lee et al. |
| 2015/0259779 A1 | 9/2015 | Ma et al. |
| 2015/0361546 A1 | 12/2015 | Ochi et al. |

FOREIGN PATENT DOCUMENTS

| | | | |
|---|---|---|---|
| CN | 203999787 | 12/2014 | |
| JP | 57076842 | 5/1982 | |
| TW | 201439352 A | 10/2014 | |
| WO | WO-2008132777 A1 * | 11/2008 | ............. A61B 3/102 |

OTHER PUBLICATIONS

International Search Report and Written Opinion for PCT/US16/18802 dated May 4, 2016; 10 pages.

Second Chinese Office Action for Chinese Application No. 201680011162.2 dated Apr. 23, 2020, 7 pages.

* cited by examiner

SELECTIVE STEP COVERAGE FOR MICRO-FABRICATED STRUCTURES

CROSS REFERENCE TO RELATED PATENTS

The present Application for Patent is a Divisional of U.S. patent application Ser. No. 15/047,032 filed in the U.S. Patent and Trademark Office on Feb. 18, 2016, the entire content of which is incorporated herein by reference as if fully set forth below in its entirety and for all applicable purposes. U.S. patent application Ser. No. 15/047,032 claims priority pursuant to 35 U.S.C. § 119(e) to U.S. Provisional Application Ser. No. 62/119,065, entitled "Selective Step Coverage for Micro-Fabricated Structures,", filed Feb. 20, 2015, the entire content of which is incorporated herein by reference as if fully set forth below in its entirety and for all applicable purposes.

BACKGROUND OF THE INVENTION

Technical Field of the Invention

The present invention relates in general to metallization or thin film coating of optical surfaces in micro-optical bench devices, and in particular to the fabrication of a shadow mask providing selective step coverage of optical surfaces of micro-fabricated structures within micro-optical bench devices.

Description of Related Art

Deeply etched micro-optical benches are typically formed using a Deep Reactive Ion Etching (DRIE) process on Silicon On Insulator (SOI) wafers in order to produce micro-optical and Micro-Electro-Mechanical Systems (MEMS) components that are able to process free-space optical beams propagating parallel to the SOI substrate. Conventionally, a one-level shadow mask is used to provide step coverage and selective metallization or thin film coating of optical surfaces within deeply etched micro-optical benches.

However, protection of nearby optical surfaces from thin film coating requires separating the coated and non-coated surfaces by a sufficient distance to avoid inadvertent coating of non-coated surfaces. Therefore, the optical propagation distance within micro-optical bench devices is limited to the design rules of the shadow mask.

Figure 1:
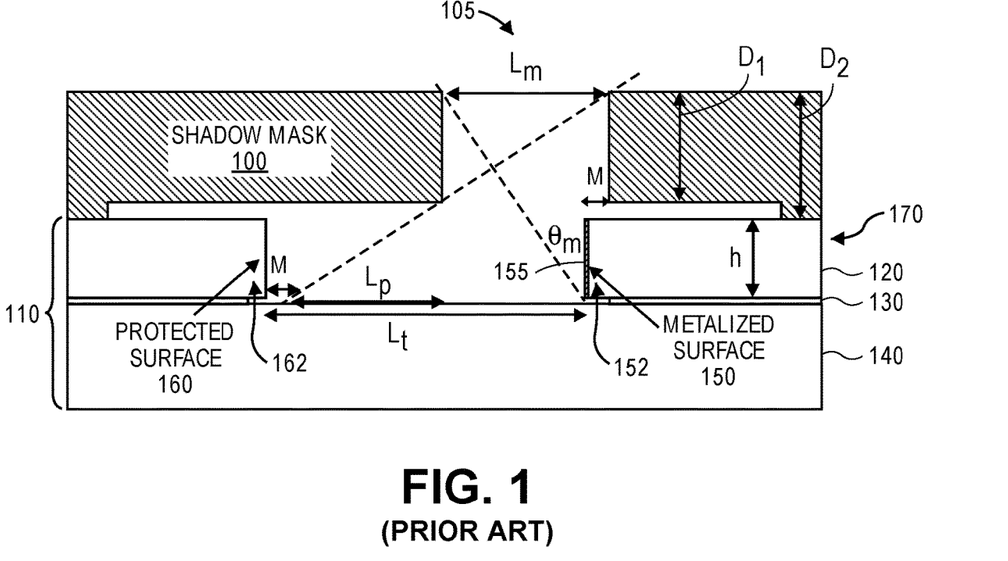
FIG. 1 illustrates an exemplary prior art one-level shadow mask for use in metallizing etched surfaces of a substrate, in accordance with aspects of the present disclosure.

FIG. 1 illustrates an exemplary prior art one-level shadow mask 100 for use in metallizing etched surfaces of a substrate 110, such as a Silicon On Insulator (SOI) wafer/substrate. The substrate 110 includes a device layer 120, an etch stop or sacrificial (e.g., buried oxide (BOX)) layer 130 and a handle layer 140. Various micro-fabricated structures (e.g., structures 152 and 162) of a micro-optical bench device 170 are etched into the device layer 120 using, for example, a DRIE Bosch process, to expose micro-optical surfaces 150 and 160. To sputter a coating material 155 (e.g., metal layer) on one of the surfaces (e.g., surface 150), an opening in the shadow mask of width $L_m$ is required, assuming a metallization angle, $\theta_m$. From geometry, the metallization opening width is given by:

$$L_m = M + (h + D_2)\tan\theta_m \quad \text{(Equation 1)}$$

where M, h and $D_2$ are the misalignment margin, the SOI device layer height and the shadow mask thickness, respectively.

To protect an opposite micro-optical surface (e.g., surface 160) from being metallized, a protection distance $L_p$ from the metallization opening is required. The protection distance is directly proportional to the metallization opening width and device layer height, and is given by:

$$L_p = L_m\left(\frac{h + D_2}{D_1} - 1\right) \quad \text{(Equation 2)}$$

Where $D_1$ is the thickness of the shadow mask excluding recessed part above the SOI wafer. Thus, the total distance between a metallized surface 150 and a protected surface 160 is given by:

$$L_t = (M + (h + D_2)\tan\theta_m)\left(\frac{h + D_2}{D_1}\right) \approx \left(\frac{h^2}{D^2} + 2h + D_2\right)\tan\theta_m \quad \text{(Equation 3)}$$

From the above equations, it can be deduced that increasing the device layer height, which may be required for better optical coupling efficiency, directly affects the minimum optical propagation distance that can be achieved using a one-level shadow mask for metallization or thin film coating of vertical micro-optical surfaces. On the other hand, increasing the thickness of the one-level shadow mask increases the required metallization opening, while at the same time reduces the protection distance.

Therefore, what is needed is a shadow mask designed to provide selective step coverage of micro-fabricated structures within a micro-optical bench device with minimal protection distance between optical surfaces.

SUMMARY OF THE INVENTION

Various aspects of the present disclosure provide a shadow mask for use in selectively coating micro-fabricated structures within a micro-optical bench device. The shadow mask includes a first opening within a top surface of the shadow mask and a second opening within a bottom surface of the shadow mask. The second opening is aligned with the first opening and has a second width less than a first width of the first opening. An overlap between the first opening and the second opening forms a hole within the shadow mask through which selective coating of micro-fabricated structures within the micro-optical bench device may occur.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

In accordance with aspects of the present disclosure, selective metallization or thin film coating of optical surfaces of micro-fabricated structures within micro-optical bench devices is performed using two or more levels of openings in a shadow mask, placed above the micro-optical bench device. The multi-level shadow mask enables forming optical mirrors in Silicon-On-Insulator SOI wafers with smaller bench foot print (i.e., reduced optical propagation distance) and controlled thin film coating of the micro-optical components inside the micro-optical bench device. The size and shape of the top level shadow mask openings are used to control the profile and thickness of the deposited thin film. The second level shadow mask openings are used to control the spread of the deposition and to protect the surfaces that are not to be coated. The multi-level shadow mask may further improve the uniformity of coating from one optical surface to another inside a single micro-optical bench device and across a wafer containing multiple micro-optical bench devices before singulation of the wafer.

Figure 2:
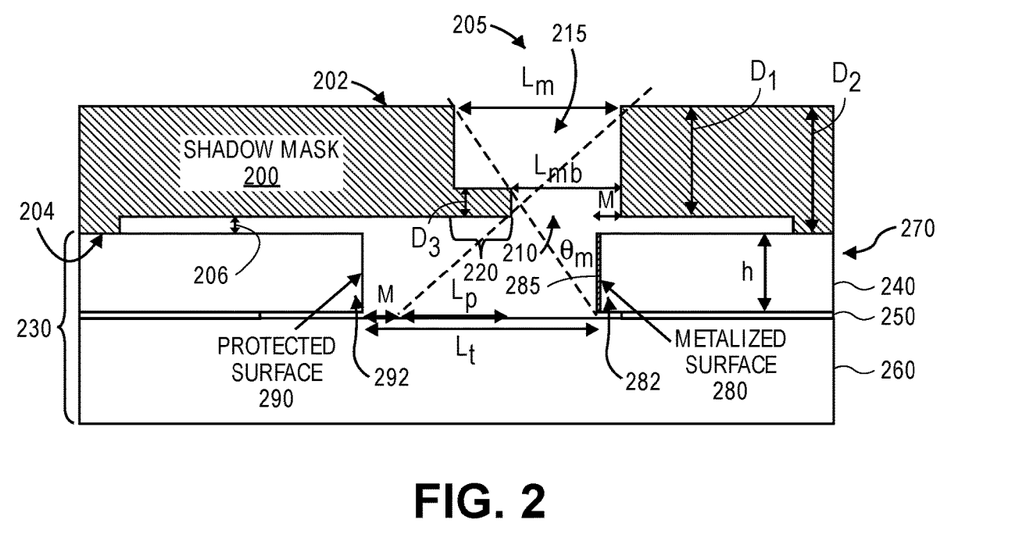
FIG. 2 illustrates an exemplary multi-level shadow mask for use in providing selective step coverage for micro-fabricated structures, in accordance with aspects of the present disclosure.

FIG. 2 illustrates an exemplary multi-level shadow mask 200 for use in providing selective step coverage for micro-fabricated structures within a micro-optical bench device 270, in accordance with aspects of the present disclosure. The micro-optical bench device 270 is fabricated within a substrate 230, such as a Silicon On Insulator (SOI) wafer/substrate. The substrate 230 includes a device layer 240, an etch stop or sacrificial (e.g., buried oxide (BOX)) layer 250 and a handle layer 260. Various micro-fabricated structures (e.g., structures 282 and 292) of the micro-optical bench device 270 are etched into the device layer 240 using, for example, a DRIE Bosch process, to expose optical surfaces 280 and 290 thereof. As shown in FIG. 2, the etched optical surfaces 280 and 290 are out-of-plane with respect to the substrate 230 and may be vertical or at an inclination angle with respect to the plane of the substrate 230

The shadow mask 200 may be, for example, formed of a silicon (Si) substrate or other type of substrate (e.g., plastic, glass, etc.) that has a top surface 202 and a bottom surface 206. The multiple levels of the shadow mask 200 are formed using two or more openings therein. For example, as shown in FIG. 2, the shadow mask 200 includes a first opening 205 within the top surface 202 of the shadow mask 200 and a second opening 210 within the bottom surface 204 of the shadow mask 200. The second opening 210 is aligned with the first opening 205 and has a width $L_{mb}$ that is less than the width $L_m$ of the first opening 205. The overlap between the widths of the first and second openings 205 and 210 forms a hole 215 within the shadow mask 200 that extends through the top and bottom surfaces 202 and 204 thereof. Although not shown, it should be understood that additional openings between the first and second openings 205 and 210 may also be included within the shadow mask.

A recessed portion 206 of the shadow mask 200 provides a gap between the shadow mask 200 and the moving/fragile micro-fabricated structures 282 and 292 within the micro-optical bench device 270. By having different widths for the first and second opening 205 and 210, a protection lip 220 may be formed within the shadow mask 200, in which the width of the protection lip 220 corresponds to a difference between the first width $L_m$ of the first opening 205 and the second width $L_{mb}$ of the second opening 210. The protection lip 220 enables protection of a surface 290 during deposition of the coating material (i.e., metal layer) on an opposing surface 280.

As can be seen in FIG. 2, there are three different shadow mask levels, denoted by $D_1$, $D_2$ and $D_3$. The first level $D_1$ of the shadow mask 200 includes the thickness of the shadow mask 200 less the recessed portion 206 and corresponds to the depth of the hole 215. The second level $D_2$ of the shadow mask 200 includes the total thickness of the shadow mask 200 including the recessed portion 206. The third level $D_3$ of the shadow mask 200 includes the thickness of the shadow mask 200 corresponding to the depth of the second opening 210, in which $D_3$ is much smaller than $D_2$. Thus, the third level $D_3$ of the shadow mask 200 extends from the recessed bottom surface 204 of the shadow mask 200 through the depth of the second opening 210. In addition, the first opening 205 extends from the top surface 202 of the shadow mask 200 through a thickness corresponding to a difference between $D_1$ and $D_3$. Furthermore, the protection lip 220 is formed within the third level $D_3$ of the shadow mask 200.

The different levels are designed to expose some optical surfaces (e.g., surface 280), while at the same time protect other optical surfaces (e.g, surface 290) within the micro-optical bench device 270. Thus, these levels represent the control parameters for selective metallization or thin film coating of the micro-optical bench device 270. By optimizing these levels, smaller micro-fabricated structures 282 and 292 with shorter optical propagation distances therebetween can be achieved. In addition, optimization of the levels may further control the optical quality of the micro-mirrors and optical interfaces within the micro-optical bench device 170. Consequently, the multi-level shadow mask 200 enhances the optical efficiency of the micro-optical bench device 170.

In an aspect of the disclosure, the distance between a surface to be metallized/coated (e.g., surface 280) and a surface to be protected from metallization/thin film coating (e.g., surface 390) may be minimized by controlling the shadow mask levels. For example, the width of the top level opening 205 may be the same as that shown in FIG. 1, and thus, given by Equation 1. However, by having a shadow mask with large thickness $D_2$, while still offering the same metallization properties through the second level of thickness $D_3$, the protection distance $L_p$, may be reduced as indicated in the following equation:

$$L_p = [L_m - (D_1 - D_3)\tan\theta_m]\left(\frac{h+D_2}{D_1} - 1\right) \quad \text{(Equation 4)}$$

In addition, the total distance $L_t$ between the metallized surface 280 and the protected surface 290 may be given by:

$$L_t = (M + (h + D_3 + D_2 - D_1)\tan\theta_m)\left(\frac{h+D_2}{D_1}\right) \approx \quad \text{(Equation 5)}$$

$$\left[\left(\frac{h^2}{D_2} + h + D_3\right)\tan\theta_m\right]$$

Using a shadow mask thickness twice as large as the conventional shadow mask thickness $D_0$, such that $D_2=2D_0$, and using $D_3=D_0/2$, the total optical propagation distance ($L_t$) may be reduced to half of the value when using the conventional shadow mask. Further reduction may also be achieved by further increases in $D_2$ and/or decreases in $D_3$.

The thickness and profile of the coating material 285 (i.e., metal layer) deposited on the optical surface 280 may be controlled by the sputtering time and the top opening width $L_m$, while the spread of the metal on the substrate ($\approx L_t$) may be controlled by the bottom opening width $L_{mb}$, which is given by:

$$L_{mb} = M + (h + D_3 + D_2 - D_1)\tan\theta_m \quad \text{(Equation 6)}$$

Figure 3:
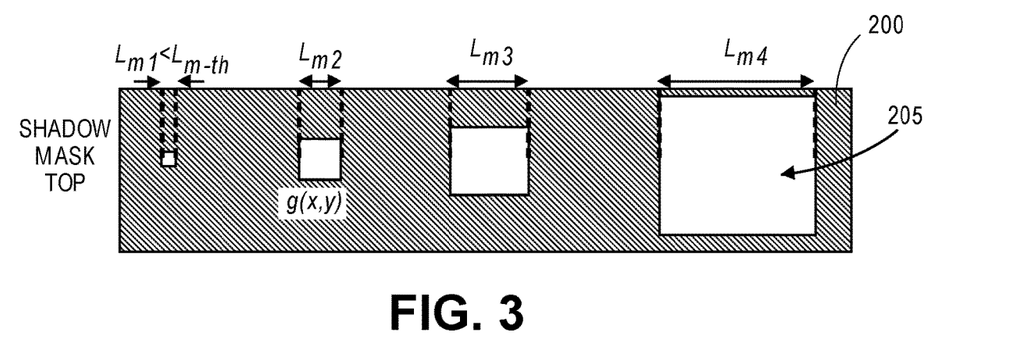
FIG. 3 illustrates exemplary shadow mask top level openings, in accordance with aspects of the present disclosure.
Figure 4:
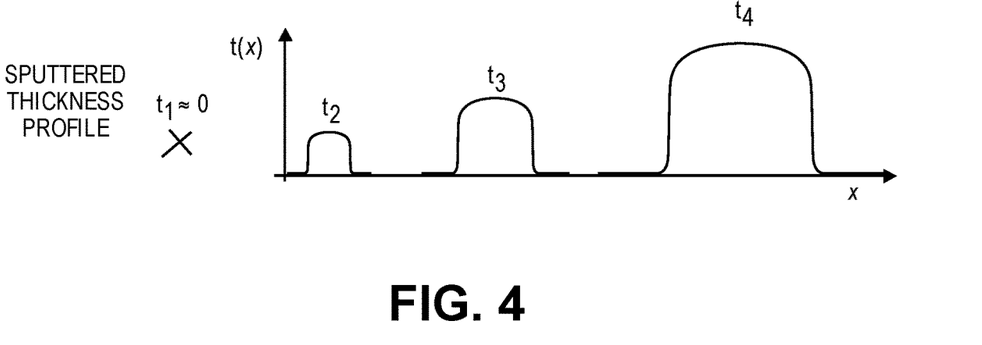
FIG. 4 is a diagram illustrating exemplary profiles and thicknesses of thin films deposited using the different shadow mask top level openings shown in FIG. 3, in accordance with aspects of the present disclosure.
Figure 5:
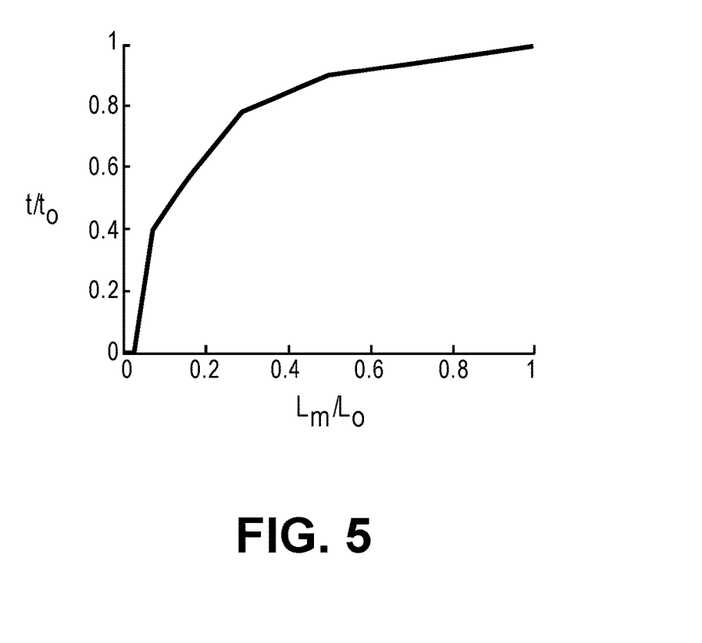
FIG. 5 is a diagram illustrating the dependence of the sputtered thin film thickness on the shadow mask top level opening size, in accordance with aspects of the present disclosure.

Thus, the sputtered metal thickness profile and maximum thickness value may be controlled by the shadow mask opening shape and profile, respectively, as shown in FIG. 3. The shape of the shadow mask top opening $g(x,y)$ controls the profile shape of the sputtered thin film $t(x,y)$. By changing the opening size from $L_{m1}$ to $L_{m2}$ ... to $L_{m4}$, the maximum achievable thickness is controlled from $t_1$ to $t_2$ ... to $t_4$, as shown in FIG. 4. If the opening size is smaller than a given threshold value $L_{m-th}$, the sputtering thickness will be negligible. This threshold value is controlled by the process conditions, including the distance between the target and the wafer in the reactor, biasing power and the sputtering gas. In addition, the threshold value depends on the overall thickness of the shadow mask used. An example experimental dependence of the thin firm thickness on the opening size is shown in FIG. 5. For large opening size, the thickness saturates a certain value. This value is controlled by the process time and process conditions.

Figure 6:
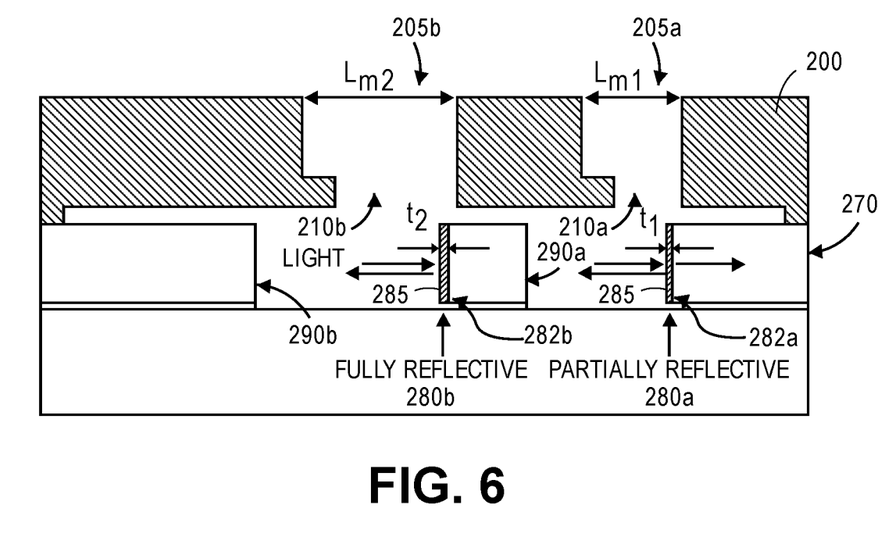
FIG. 6 illustrates an exemplary shadow mask having different top level opening sizes, in accordance with aspects of the present disclosure.

Referring now to FIG. 6, the shadow mask 200 may have different opening sizes simultaneously leading to different metallization or thin film thickness. This may enable, for example, the formation of fully reflective mirrors 282b and partially reflective/transmitting mirrors 280a with controlled transmission. In the example shown in FIG. 6, there are two different top level openings 205a and 205b in the shadow mask 200, each with a different width $L_{m1}$ and $L_{m2}$. The different top level opening sizes lead to two different thin film thicknesses $t_1$ and $t_2$ on the coated optical surfaces 280a and 280b of micro-fabricated structures 282a and 282b. If the thin film 285 is metal, the coated surfaces 280a and 280b may have different reflectivity and transmission characteristics, depending on the metal thickness with respect to the optical skin depth at the given wavelength of the light propagating in the micro-optical bench 270. If one or both of the metallized surfaces 280a and 280b coating thickness is much larger than the skin depth, then the surface (e.g., surface 280b) will act as a fully reflecting surface with the respect to the incident light.

The widths of the bottom level openings 210a and 210b may be the same or different. For example, the widths of the bottom level openings 210a and 210b may be selected to provide protection to other surfaces 290a and 290b within the micro-optical bench device 270 during deposition of the coating material 285 on coated surfaces 280a and 280b.

Figure 7A:
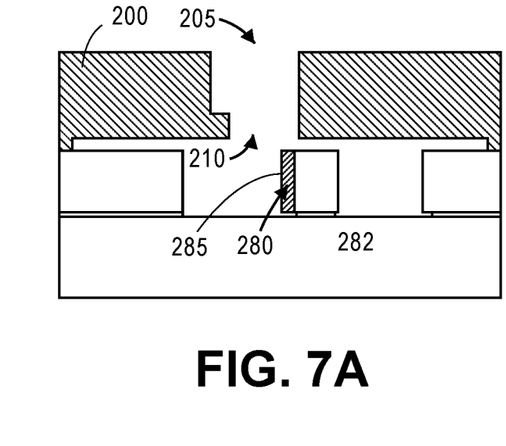
FIGS. 7A and 7B illustrate exemplary multi-level shadow masks that can achieve uniform and non-uniform step coverage across optical surface heights, in accordance with aspects of the present disclosure.
Figure 7B:
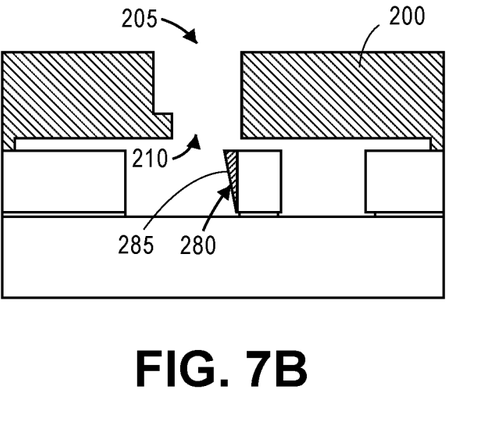

Referring now to FIGS. 7A and 7B, both uniform and non-uniform step coverage may be achieved using the multi-level shadow mask 200. For example, the shadow mask top level and bottom level opening sizes 205 and 210, respectively, along with the process conditions, may be optimized to produce either uniform coating across the height of the optical surface 280, as shown in FIG. 7A, or non-uniform coating, as shown in FIG. 7B. The non-uniform coating can lead to, for example, a wedge shape of the coating material 285, as can be seen in FIG. 7B.

Figure 8:
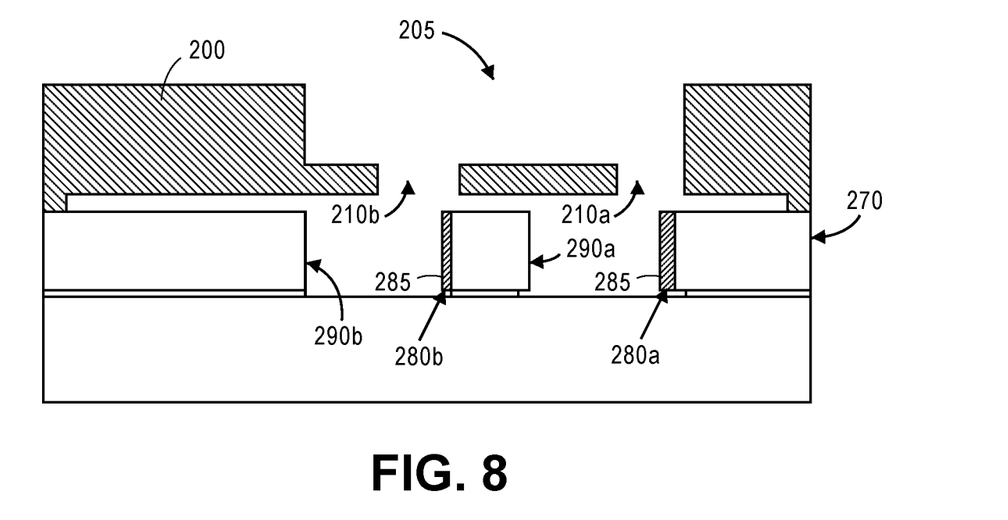
FIG. 8 illustrates an exemplary shadow mask having a large top level opening selected to provide uniform coating to multiple optical surfaces within a micro-optical bench device, in accordance with aspects of the present disclosure.

Referring now to FIG. 8, to simultaneously control the thin film thickness on multiple optical surfaces 280a and 280b of the micro-optical bench device 270, the shadow mask 200 may include a single large top level opening 205 overlapping two or more bottom level openings 210a and 210b. In one example, the top level opening 205 may provide the same thin film thickness on both optical surfaces 280a and 280b of the micro-optical bench device 270. The bottom level openings 210a and 210b may be used to control the spread of the thin film material 285 and to protect other non-coated surfaces 290a and 290b.

Figure 9:
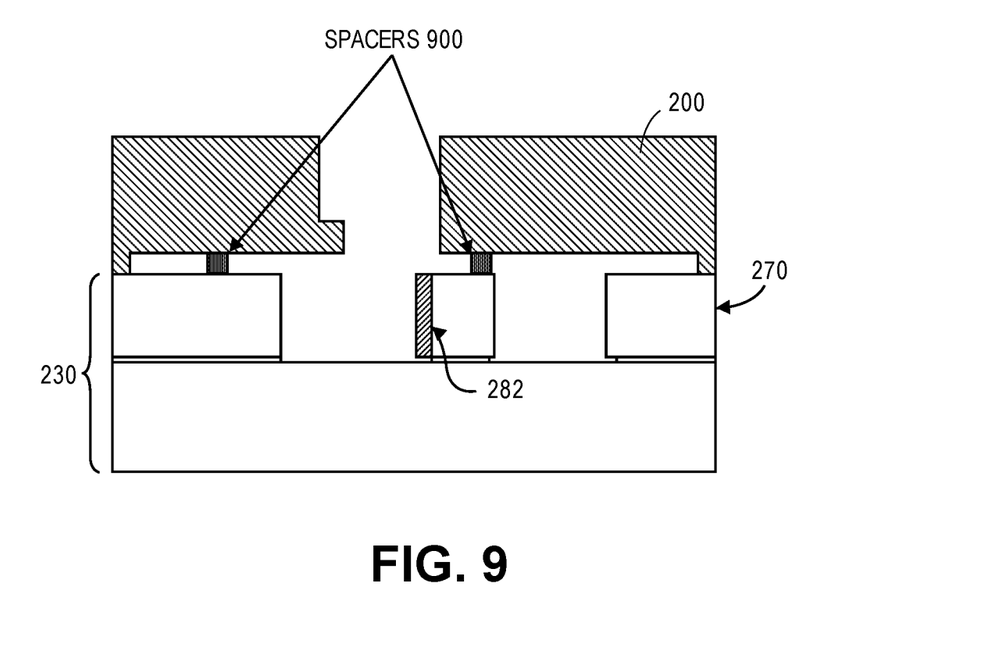
FIG. 9 illustrates an exemplary shadow mask including spacers between the shadow mask and the substrate, in accordance with aspects of the present disclosure.

FIG. 9 illustrates an exemplary shadow mask 200 including spacers 900 between the shadow mask 200 and the substrate 230, in accordance with aspects of the present disclosure. The spacers 900 may control the thin film thickness across the wafer and prevent stress on the shadow mask 200, thus preventing bending of the shadow mask 200. The spacers 900 may be distributed between the shadow mask 200 and the substrate/wafer 230 before singulation. In one example, the spacers 900 may be distributed in the bottom level (i.e., recessed portion) of the shadow mask 200 and may be etched in the shadow mask using a photolithographic mask on the bottom surface of the shadow mask 200. The spacers 900 may be positioned in the bottom level so as to not overlap with the moving/fragile micro-fabricated structures 282 in the micro-optical bench device 270. The stoppers 900 may maintain a nearly constant gap between the recessed bottom surface of the shadow mask 200 and the top surface of the substrate 230, and thus, may improve uniformity of metallization across the substrate/wafer 230.

Figure 10:
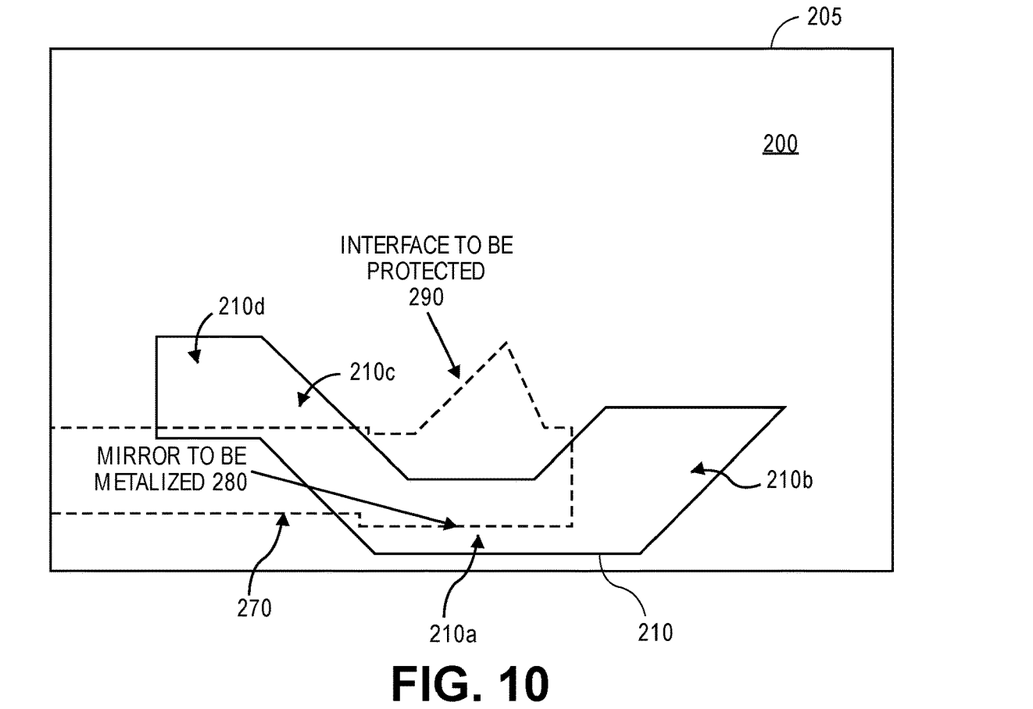
FIG. 10 is a top view of a layout of an exemplary multi-level shadow mask, in accordance with aspects of the present disclosure.

FIG. 10 is a top view of a layout of an exemplary multi-level shadow mask 200, in accordance with aspects of the present disclosure. In the example shown in FIG. 10, the bottom level opening 210 can be seen through the top level opening 205 in the shadow mask 200. The bottom level opening 210 includes several sub-openings 210a-210d aligned in different directions to produce the desired thin film coating on the micro-optical bench device 270 (shown as a dotted line). The micro-optical bench device 270 shown in FIG. 10 forms at least a part of an optical interferometer including a micro-mirror to be metallized and an interface (e.g., a beam splitter) to be protected from metallization.

For example, one sub-opening (e.g., sub-opening 210a) may be designed to minimize the opening size in the direction connecting the micro-mirror surface 280 to be metallized and the interface surface 290 to be protected. Another sub-opening (e.g., sub-opening 210b) may be designed to maximize the opening in a tilted direction with respect to the line connecting the micro-mirror surface 280 and the interface surface 290. Thus, as can be seen in FIG. 10, the bottom level opening 210 may include a union of at least one rectangular shape and at least one parallelogram shape, where the parallelogram shape forms an opening that is tilted with respect to the rectangular shape.

Figure 11:
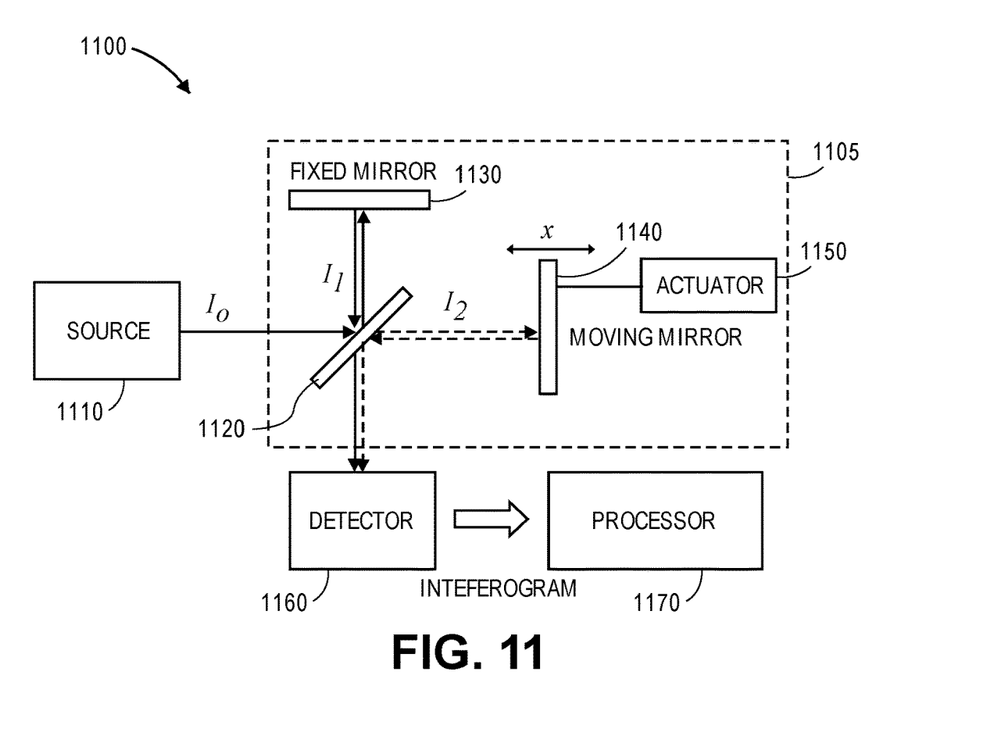
FIG. 11 illustrates an exemplary spectrometer including a Michelson interferometer that can be fabricated as a micro-optical bench device, in accordance with aspects of the present disclosure.

An example of a spectrometer including an interferometer that may be fabricated as a micro-optical bench device is shown in FIG. 11. In the example shown in FIG. 11, the spectrometer 1100 includes a Michelson interferometer 1105. However, in other examples, other types of interferometers, such as Fabry-Perot and Mach-Zehnder interferometers, may be utilized. In FIG. 11, collimated light $I_0$ from a broadband source 1110 is split into two beams $I_1$ and $I_2$ by a beam splitter 1120. One beam $I_1$ is reflected off a fixed mirror 1130 and the other beam $I_2$ is reflected off a moving mirror 1140 coupled to an actuator 1150, such as a MEMS actuator. It should be noted that the (light) coupling efficiency of the interferometer 1150 may be maximized by optimizing the step coverage uniformity of the metal layer along the height of the fixed and moveable mirrors 1130 and 1140 using a multi-level shadow mask 200, as discussed above.

In one example, the MEMS actuator 1150 is formed of a comb drive and spring. By applying a voltage to the comb drive, a potential difference results across the actuator 1150, which induces a capacitance therein, causing a driving force to be generated as well as a restoring force from the spring, thereby causing a displacement of moveable mirror 1140 to the desired position for reflection of the beam $L_2$. An optical path length difference (OPD) is then created between the reflected beams that is substantially equal to twice the mirror 1140 displacement.

The reflected beams interfere at the beam splitter 1120, allowing the temporal coherence of the light to be measured at each different Optical Path Difference (OPD) offered by the moving mirror. The signal, called the interferogram, is measured by a detector 1160 at many discrete positions of the moving mirror. The spectrum may then be retrieved, for example, using a Fourier transform carried out by a processor 1170.

The processor 1170 may be a single processing device or a plurality of processing devices. Such a processing device may be a microprocessor, micro-controller, digital signal processor, microcomputer, central processing unit, field programmable gate array, programmable logic device, logic circuitry, analog circuitry, digital circuitry, and/or any device that manipulates signals (analog and/or digital) based on hard coding of the circuitry and/or operational instructions. The processor 1170 may have an associated memory and/or memory element, which may be a single memory device, a plurality of memory devices, and/or embedded circuitry of the processor. Such a memory device may be a read-only memory, random access memory, volatile memory, non-volatile memory, static memory, dynamic memory, flash memory, cache memory, and/or any device that stores digital information.

Figure 12:
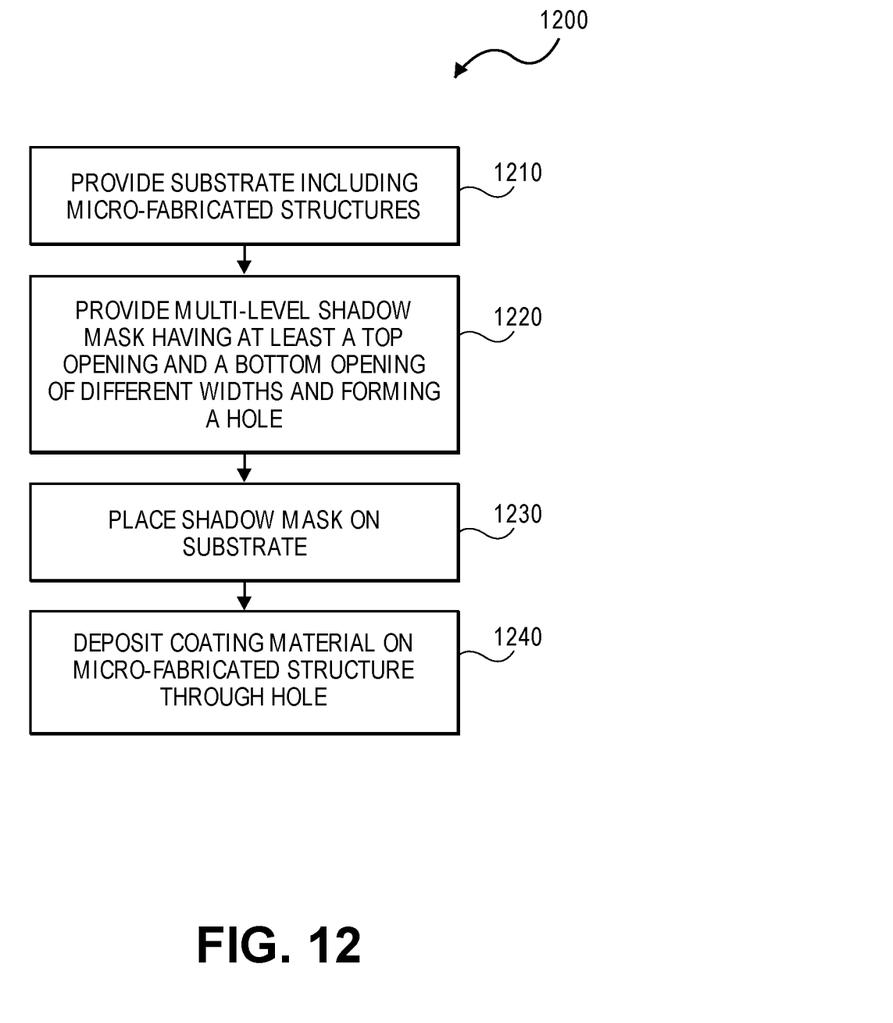
FIG. 12 is a flowchart illustrating an exemplary method for selective coating of micro-fabricated structures within a micro-optical bench device using a multi-level shadow mask, in accordance with aspects of the present disclosure.

FIG. 12 is a flowchart illustrating an exemplary method 1200 for selective coating of micro-fabricated structures within a micro-optical bench device using a multi-level shadow mask, in accordance with aspects of the present disclosure. The method 1200 begins at block 1210 by providing a substrate including micro-fabricated structures forming a micro-optical bench device. At block 1220, a multi-level shadow mask is provided that includes a first opening within a top surface of the shadow mask and a second opening within a bottom surface of the shadow mask. The second opening is aligned with the first opening and has a width less than the width of the first opening, such that an overlap between the first opening and the second opening form a hole within the shadow mask.

At block 1230, the shadow mask is placed on the substrate in a position to enable a surface of a micro-fabricated structure to be coated through the hole. In particular, the bottom surface of the shadow mask is placed adjacent to a top surface of the substrate and the micro-fabricated structure surface to be coated is aligned with the hole. At block 1240, a coating material, such as a metal layer, is deposited on the surface of the micro-fabricated structure through the hole.

Figure 13A:
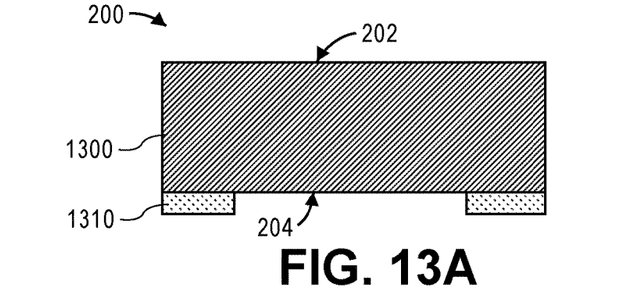
FIGS. 13A-13F illustrate an exemplary process for fabricating a multi-level shadow mask, in accordance with aspects of the present disclosure.
Figure 13B:
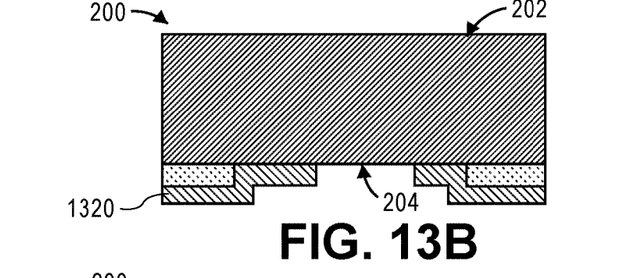
Figure 13C:
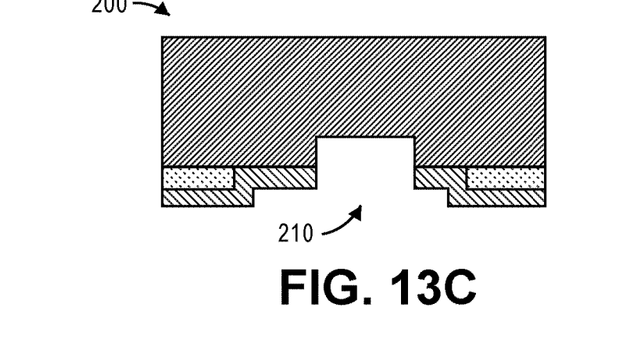

FIGS. 13A-13F illustrate an exemplary process for fabricating a multi-level shadow mask 200, in accordance with aspects of the present disclosure. As shown in FIG. 13A, a substrate 1300 for the shadow mask is provided and a recess pattern 1310 is formed on a bottom surface 204 of the substrate 1300 through a lithography step. The recess pattern 1310 may be formed, for example, by depositing a layer of aluminum on the bottom surface 204 of the substrate 1300 and patterning the layer of aluminum to form the recess pattern 1310. Then, as shown in FIG. 13B, a layer of photo-resist 1320 is deposited on the bottom surface 204 of the substrate 1300 and patterned to form a bottom opening pattern. In FIG. 13C, the bottom opening 210 is etched in the substrate 1300 through the bottom opening pattern for a predefined depth.

Figure 13D:
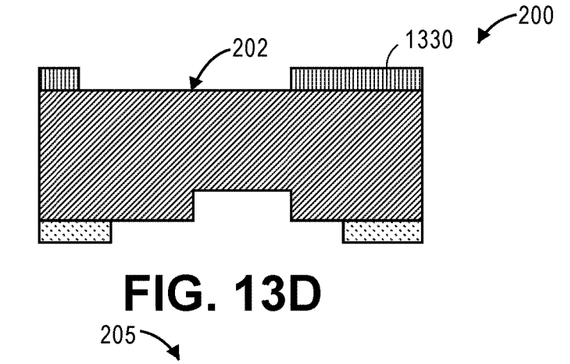
Figure 13E:
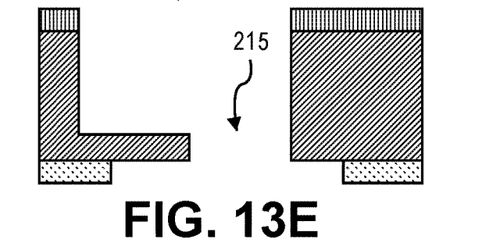
Figure 13F:
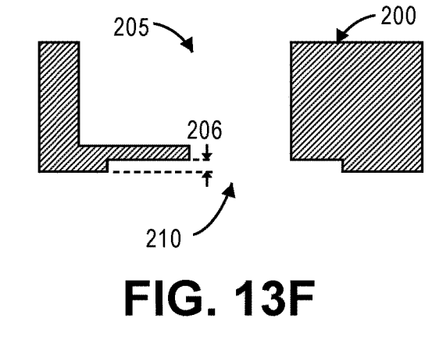

In FIG. 13D, another layer of photo-resist 1330 is deposited on the top surface 202 of the substrate 1300 and patterned to form a top opening pattern. In FIG. 13E, the top opening 205 is etched in the substrate 1300 through the top opening pattern until the top opening 205 meets the bottom opening 210, and a hole 215 forms in the substrate 1300. Finally, as shown in FIG. 13F, the shadow mask recess portion 206 is etched using the recess pattern 1310 to ensure the shadow mask 200 does not come into contact with any movable/fragile micro-fabricated structures while using the shadow mask for step coverage.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. A method for selective coating of micro-fabricated structures within a micro-optical bench device, comprising:
providing a substrate comprising the micro-fabricated structures;
providing a shadow mask comprising a top surface, a first bottom surface, and a second bottom surface formed from a recessed portion of the first bottom surface, the shadow mask further comprising a first opening within the top surface and a second opening within the second bottom surface, wherein the second opening is aligned with the first opening and has a second width less than a first width of the first opening, a first overlap between the first opening and the second opening forming a first hole within the shadow mask, wherein the shadow mask further comprises a protection lip along the second bottom surface opposite a first sidewall of the first hole, the protection lip being on only another side of the first hole opposite the first sidewall, the protection lip comprising a lip width corresponding to a difference between the first width of the first opening and the second width of the second opening, the protection lip further comprising a lip thickness corresponding to a difference between a first depth of the first hole extending from the top surface to the second bottom surface and a second depth of the first opening;

placing the shadow mask on the substrate such that the first bottom surface of the shadow mask is touching the substrate and the second bottom surface of the shadow mask faces the substrate with a gap therebetween;

sputter depositing a coating material on a first surface of a first micro-fabricated structure of the substrate through the first hole, wherein the first surface is out-of-plane with respect to a plane of the substrate; and using the protection lip to protect a second surface of a second micro-fabricated structure of the substrate from the coating material during the sputter depositing of the coating material on the first surface of the first micro-fabricated structure, wherein the second surface of the second micro-fabricated structure opposes the first surface of the first micro-fabricated structure on the substrate.

2. The method of claim 1, wherein the shadow mask comprises a first thickness corresponding to the first depth of the first hole, a second thickness greater than the first thickness and corresponding to a total thickness of the shadow mask extending from the top surface to the first bottom surface, and a third thickness less than the first thickness and corresponding to a third depth of the second opening, wherein the first opening extends from the top surface through a fourth thickness corresponding to the second depth of the first opening, wherein the second depth of the first opening corresponds to a difference between the first thickness and the second thickness.

3. The method of claim 2, wherein the shadow mask further comprises at least one spacer on the second bottom surface thereof, wherein the at least one spacer comprises a fifth thickness corresponding to a difference between the first thickness and the second thickness.

4. The method of claim 2, wherein a distance between the first surface of the first micro-fabricated structure and the second surface of the second micro-fabricated structure is a minimum distance based on the first width of the first opening, the first thickness of the shadow mask and the second thickness of the shadow mask.

5. The method of claim 1, wherein the micro-optical bench device comprises an interferometer, the first micro-fabricated structure comprises a micro-mirror and the second micro-fabricated structure comprises a beam splitter.

6. The method of claim 5, wherein the coating material includes a metal layer.

7. The method of claim 6, wherein the sputter depositing the coating material further comprises: maximizing a coupling efficiency of the interferometer based on a step coverage uniformity of the metal layer along a height of the micro-mirror.

8. The method of claim 5, wherein the micro-mirror is moveable.

9. The method of claim 2, wherein the sputter depositing the coating material further comprises: controlling a profile and thickness of the coating material deposited on the first surface of the first micro-fabricated structure using the first opening of the shadow mask; and controlling spreading of the coating material on the substrate using the second opening of the shadow mask.

10. The method of claim 1, wherein providing the shadow mask further comprises:
providing a third opening within the top surface of the shadow mask; and
providing a fourth opening separate from the second opening within the second bottom surface of the shadow mask;
wherein the fourth opening is aligned with the third opening and has a fourth width less than a third width of the third opening, a second overlap between the third opening and the fourth opening forming a second hole within the shadow mask.

11. The method of claim 10, further comprising: the sputter depositing the coating material on a third surface of a third micro-fabricated structure through the second hole.

12. The method of claim 11, wherein the third width of the third opening is different than the first width of the first opening.

13. The method of claim 11, wherein the sputter depositing the coating material further comprises: controlling a respective thickness of the coating material deposited on the first surface of the first micro-fabricated structure and the third surface of the third micro-fabricated structure based on a difference between the first width of the first opening and the third width of the third opening.

14. The method of claim 10, wherein the fourth width of the fourth opening is different than the second width of the second opening.

15. The method of claim 10, wherein providing the shadow mask further comprises:
forming a fifth opening in the top surface of the shadow mask from a combination of the first opening and the third opening.

16. The method of claim 1, wherein the sputter depositing the coating material further comprises: the sputter depositing the coating material on the first surface of the first micro-fabricated structure through the first hole to produce a non-uniform step coverage of the coating material across a height of the first surface.

17. The method of claim 1, wherein providing the shadow mask further comprises:
providing the second opening in the second bottom surface of the shadow mask with a first sub-opening having first opening size and a second sub-opening having a second opening size greater than the first opening size.

18. The method of claim 17, wherein the second sub-opening is in a same plane as the first sub-opening and tilted with respect to the first sub-opening.

19. The method of claim 1, wherein the providing the shadow mask further comprises:
providing a first patterned layer of photo-resist on the first bottom surface of the shadow mask, the first patterned layer of photo-resist having a first mask opening therein;
etching the shadow mask on the first bottom surface through the first mask opening to form the second opening on the first bottom surface of the shadow mask;

providing a second patterned layer of photo-resist on the top surface of the shadow mask, the second patterned layer of photo-resist having a second mask opening therein; and etching the shadow mask on the top surface through the second mask opening to form the first opening on the top surface of the shadow mask.

20. The method of claim 19, wherein the etching the shadow mask to form the first opening and the etching the shadow mask to form the second opening each utilize Deep Reactive Ion Etching (DRIE).

\* \* \* \* \*